US010474957B2

(12) United States Patent
Zhang et al.

(10) Patent No.: US 10,474,957 B2
(45) Date of Patent: Nov. 12, 2019

(54) METHOD AND APPARATUS FOR FORECASTING CHARACTERISTIC INFORMATION CHANGE

(71) Applicant: BEIJING BAIDU NETCOM SCIENCE AND TECHNOLOGY CO., LTD., Beijing (CN)

(72) Inventors: Jiewei Zhang, Beijing (CN); Xiao Zhang, Beijing (CN); Jian He, Beijing (CN); Jing Huang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 734 days.

(21) Appl. No.: 14/902,303

(22) PCT Filed: Dec. 16, 2014

(86) PCT No.: PCT/CN2014/093952
§ 371 (c)(1),
(2) Date: Dec. 30, 2015

(87) PCT Pub. No.: WO2015/158149
PCT Pub. Date: Oct. 22, 2015

(65) Prior Publication Data
US 2016/0217383 A1 Jul. 28, 2016

(30) Foreign Application Priority Data

Apr. 17, 2014 (CN) .......................... 2014 1 0154993

(51) Int. Cl.
*G06N 7/00* (2006.01)
*G06F 17/50* (2006.01)

(52) U.S. Cl.
CPC ............. *G06N 7/005* (2013.01); *G06F 17/50* (2013.01)

(58) Field of Classification Search
None
See application file for complete search history.

(56) References Cited

U.S. PATENT DOCUMENTS 6,611,726 B1  8/2003  Crosswhite
8,499,066 B1 * 7/2013  Zhang .................. H04L 47/823
                                                          709/223

(Continued)

FOREIGN PATENT DOCUMENTS

CN  101673385 A  3/2010
CN  102479190 A  5/2012

(Continued)

OTHER PUBLICATIONS

International Search Report, dated Mar. 17, 2015, for PCT/CN2014/093952, 2 pages.

*Primary Examiner* — Alan Chen
(74) *Attorney, Agent, or Firm* — Seed IP Law Group LLP

(57) ABSTRACT

Method and apparatus for forecasting a characteristic information change. Historical characteristic data in at least one computation period and current incremental data of multiple pieces of first characteristic information corresponding to a pre-estimation model is acquired. The current incremental data is used for indicating a ratio of characteristic data on a day immediately before a forecasting day of each of the multiple pieces to the historical characteristic data in the at least one computation period of each of the multiple pieces of first characteristic information. A first change information on the forecasting day of second characteristic information is determined by a forecasting process using the pre-estimation model based on the historical characteristic data and the current incremental data. Based on the first change information, change pre-estimation information on the forecasting day of the second characteristic information is (Continued)

Figure 1:
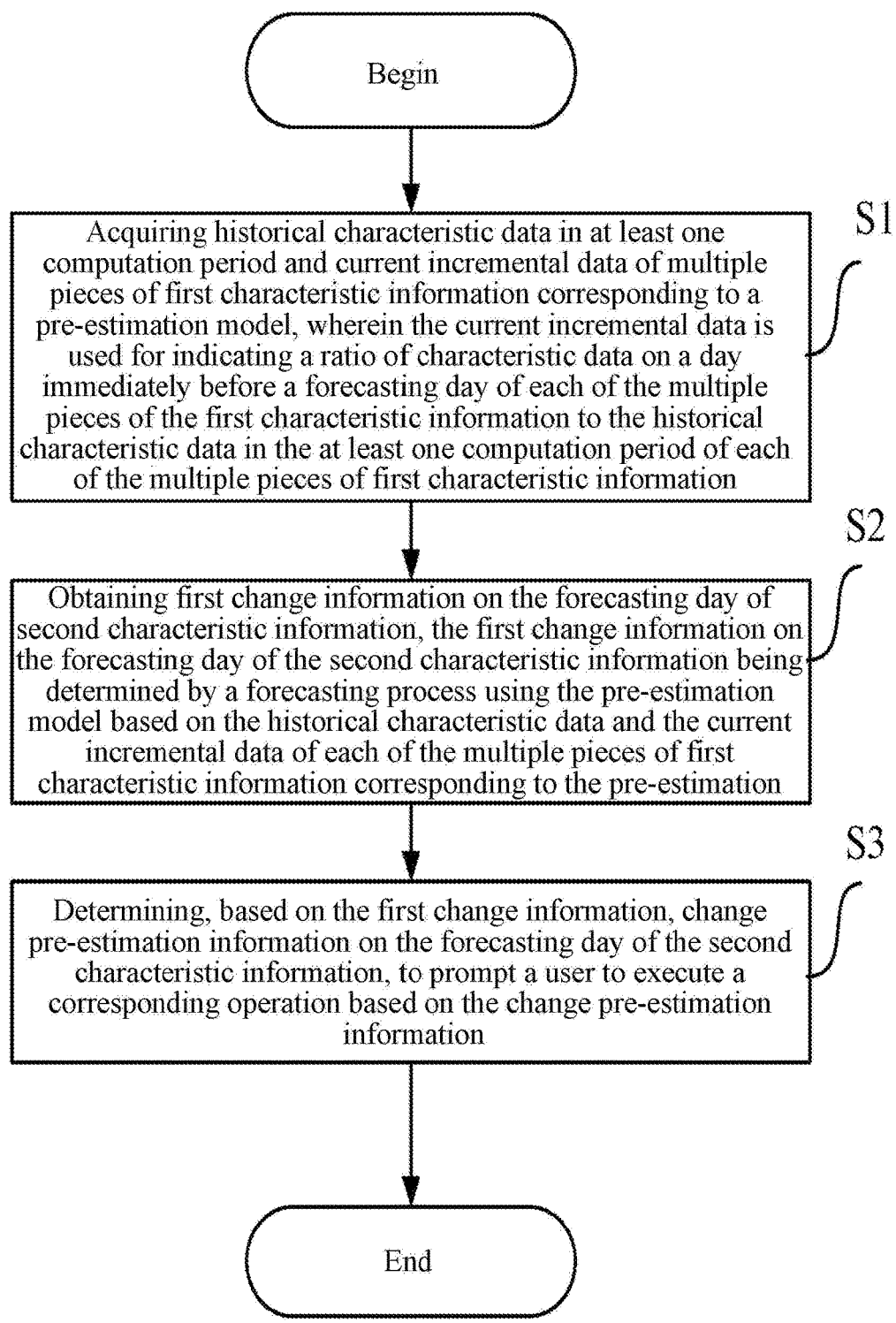

determined to prompt a user to execute a corresponding operation.

19 Claims, 3 Drawing Sheets

(56) References Cited

U.S. PATENT DOCUMENTS

| | | | |
|---|---|---|---|
| 2007/0162379 A1* | 7/2007 | Skinner | G06Q 30/02 705/37 |
| 2008/0221949 A1 | 9/2008 | Delurgio et al. | |
| 2010/0094673 A1* | 4/2010 | Lobo | G06Q 30/02 705/14.69 |
| 2012/0130804 A1 | 5/2012 | Guo et al. | |
| 2012/0303414 A1 | 11/2012 | Dodge et al. | |

FOREIGN PATENT DOCUMENTS

| | | |
|---|---|---|
| CN | 103617459 A | 3/2014 |
| CN | 103729351 A | 4/2014 |
| CN | 103971170 A | 8/2014 |

* cited by examiner

METHOD AND APPARATUS FOR FORECASTING CHARACTERISTIC INFORMATION CHANGE

FIELD OF THE INVENTION

The present invention relates to the technical field of computer, and particularly to a pre-estimation apparatus for forecasting characteristic information change.

BACKGROUND OF THE INVENTION

In the prior art, forecast of future trend in changes of certain information is generally based on historical data of the information. However, because the information change is usually affected by other factors, for example, the search volume of keywords can be affected by factors such as the delivery area of the keywords and the time, or as another example, the link click counts may be correlated with factors such as the search volume of the keywords contained in the links and the presentation area of the link, the future trend in the changes of the information cannot be properly pre-estimated based on the historical data of the information only. Particularly, when a user frequently adjusts some factors, for example, the user adjusts the desired advertising area and time, etc. of the keywords, forecasting and estimating of the future trend in the change of the relevant information becomes more difficult.

SUMMARY OF THE INVENTION

An object of the present invention is to provide a method and apparatus for forecasting the characteristic information change.

According to one aspect of the present invention, a method for forecasting a characteristic information change is provided, which comprises:

acquiring historical characteristic data in at least one computation period and current incremental data of multiple pieces of first characteristic information corresponding to a pre-estimation model, wherein the current incremental data is used for indicating a ratio of characteristic data on a day immediately before a forecasting day of each of the multiple pieces of the first characteristic information to the historical characteristic data in the at least one computation period of each of the multiple pieces of first characteristic information;

obtaining first change information on the forecasting day of second characteristic information, the first change information on the forecasting day of the second characteristic information being determined by a forecasting process using the pre-estimation model based on the historical characteristic data and the current incremental data of each of the multiple pieces of first characteristic information corresponding to the pre-estimation model; and determining, based on the first change information, change pre-estimation information on the forecasting day of the second characteristic information, to prompt a user to execute a corresponding operation based on the change pre-estimation information.

According to another aspect of the present invention, an apparatus for forecasting a characteristic information change is provided, the apparatus comprises:

means for acquiring historical characteristic data in at least one computation period and current incremental data of multiple pieces of first characteristic information corresponding to a pre-estimation model, wherein the current incremental data is used for indicating a ratio of characteristic data on a day immediately before a forecasting day of each of the multiple pieces of the first characteristic information to the historical characteristic data in the at least one computation period of each of the multiple pieces of first characteristic information;

means for obtaining first change information on the forecasting day of second characteristic information, the first change information on the forecasting day of the second characteristic information being determined by a forecasting process using the pre-estimation model based on the historical characteristic data and the current incremental data of each of the multiple pieces of first characteristic information corresponding to the pre-estimation model; and means for determining, based on the first change information, change pre-estimation information on the forecasting day of the second characteristic information, to prompt a user to execute a corresponding operation based on the change pre-estimation information.

Compared with the prior art, the present invention has the following advantages: 1) A pre-estimation model for forecasting second characteristic information is established based on first characteristic information, thereby effectively reflecting the mutual influence relationship between the individual characteristic information, pre-estimation accordingly the characteristic information within a certain future period based on the pre-estimation model; facilitating the user's understanding of the future trend in the change of the characteristic information; and enhancing user experience by performing corresponding operations based on the presented pre-estimation information; 2) through the pre-estimation in conjunction with the operation performed by the user the characteristic value in a certain future period of the second characteristic information, the accuracy of the pre-estimation information is further enhanced, a desire of the user to understand the characteristic information change in the future is met, and the pre-estimation accuracy is enhanced. In addition, according to the method of the present invention, the corresponding resource configuration can be adjusted based on the result of the pre-estimation such that the global service resource can be more effectively utilized, thereby the service corresponding to each of the characteristic information is better supported.

BRIEF DESCRIPTION OF THE ACCOMPANYING DRAWINGS

Figure 2:
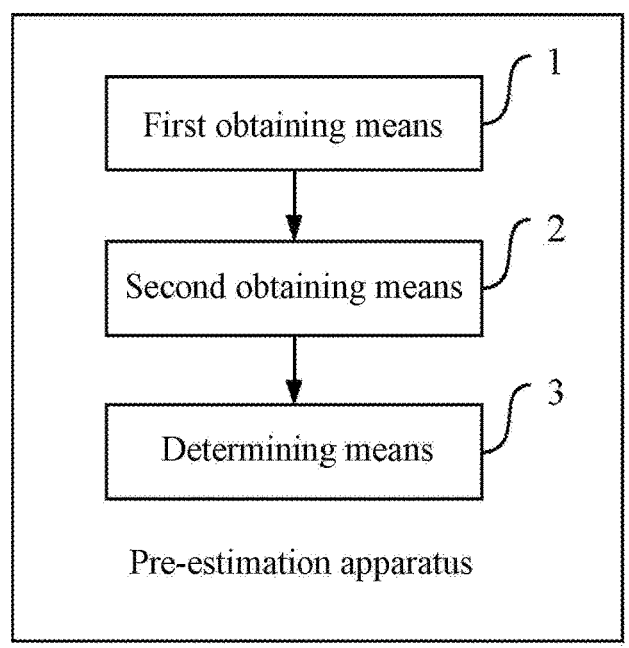
Figure 3:
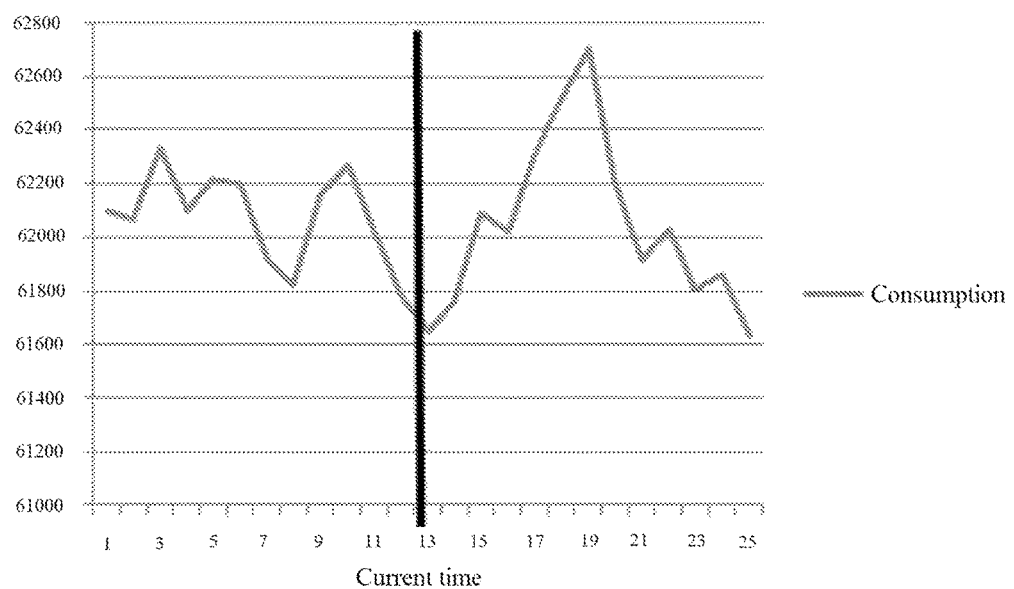

Other features, objects and advantages of the present application will become more apparent from a reading of the detailed description of the non-limiting embodiments, said description being given in relation to the accompanying drawings, among which:

FIG. 1 schematically shows a flow chart of a method for forecasting the characteristic information change according to the present invention;

FIG. 2 schematically shows a structural diagram of a pre-estimation apparatus for forecasting the characteristic information change according to the present invention; and FIG. 3 schematically shows an exemplary change pre-estimation curve of characteristic information according to the present invention.

Same or similar reference numerals in the accompanying drawings represent same or like parts.

DETAILED DESCRIPTION OF THE PREFERRED EMBODIMENTS

Hereinafter, the present invention will be described in further detail with reference to the accompanying drawings.

FIG. 1 schematically shows a flow chart of a method for forecasting a characteristic information change according to the present invention. The method according to the present invention comprises step S1, step S2, and step S3.

The method according to the present invention forecasts characteristic data change on one or more forecasting days of the characteristic information. The forecasting date may be determined based on the user's requirements. In a system which provides promotion information services to the user, the characteristic information includes, but is not limited to, various information indicating an information promotion effect and/or an information promotion strategy.

Preferably, in the system which provides information promotion services, the characteristic information includes, but is not limited to, at least any one of:

1) Information directly indicating the information promotion effect, for example, search volume, presentation amount, click count, consumption value, quality value, ranking of to-be-promoted information, etc.; and
2) Information indicating the information promotion strategy, for example, bid of the promotion information, number of time periods for delivering the promotion information, number of regions for delivering the promotion information, and number of competitors corresponding to the promotion information, etc.

It should be noted that examples of the above-mentioned system and corresponding characteristic information are only provided for description of the contents possibly included in the characteristic information, but should not be regarded as limitation of the characteristic information and the system to which the characteristic information belongs. Those skilled in the art may determine various characteristic information applicable to a certain system based on the actual situations and the requirements, the detailed description of which will not be repeated herein.

The method according to the present invention is implemented through a pre-estimation apparatus included in a computer device. The computer device includes an electronic device that is capable of automatically performing numeric computation and/or information processing according to preset or pre-stored instructions. The hardware of the electronic device includes, but is not limited to, a microprocessor, an application-specific integrated circuit (ASIC), a field programmable gate array (FPGA), a digital processor (DSP), an embedded device, etc. The computer device includes a network device and/or a user device.

The network device includes, but is not limited to, a single network server, a server group including several network servers, or a cloud having a large number of hosts or network servers and based on cloud computing, wherein the cloud computing is an instance of distributed computing, a super virtual computer made up by a group of loosely coupled computer sets. The user device includes, but is not limited to, any kind of electronic product which can perform human-machine interaction with the user by means of a keyboard, a mouse, a remote controller, a touch pad, or an acoustically controlled device, for example, a computer, a tablet computer, an intelligent mobile phone, a PDA, or a handheld gamer, etc. The network where the user device and network device are located includes, but is not limited to, the Internet, a wide area network, a metropolitan area network, a local area network, a VPN network, etc.

It should be noted that the user device, the network device, and the network are provided only as examples, and other existing or possible user devices, network devices, and networks in the feature, if applicable to the present invention, should also be included within the protection scope of the present invention and incorporated herein by reference.

With reference to FIG. 1, at step S1, the pre-estimation apparatus acquires historical characteristic data in at least one computation period and current incremental data of multiple pieces of first characteristic information corresponding to a pre-estimation model.

The pre-estimation model includes, but is not limited to, a model established based on at least one of the multiple pieces of first characteristic information and for forecasting the change of second characteristic information.

Preferably, the pre-estimation model may be implemented by machine learning. The pre-estimation apparatus obtains the first characteristic information and the second characteristic information in a mode which includes, but is not limited to, any one of the following:

1) Among multiple pieces of characteristic information, one of the multiple pieces of characteristic information is predetermined as the second characteristic information to be predicted, while the remaining pieces of characteristic information is used as the first characteristic information.

For example, "consumption value" is predetermined as the second characteristic information to be predicted, while the remaining pieces of characteristic information "search volume" and "ranking" are used as the first characteristic information required for establishing the pre-estimation model for predicting the second characteristic information.

2) The pre-estimation apparatus selects one of the multiple pieces of characteristic information as the second characteristic information, and selects at least one of the remaining pieces of characteristic information as the first characteristic information.

The historical characteristic data includes period average values of characteristic values of the individual characteristic information within each computation period.

Preferably, when a plurality of computation periods are involved, the pre-estimation apparatus may first obtain a plurality of period average values of the characteristic data within each computation period of the first characteristic information, and then compute a secondary average value of the plurality of period average values based on the obtained period average values, and use the secondary average value as the historical characteristic data of the first characteristic information with respect to the plurality of computation periods.

Those skilled in the art may select or determine the length of the computation period based on the actual conditions and requirements, for example, designating 7 days as a computation period, designating one month as a computation period, etc.

The current incremental data are used for indicating a ratio of first characteristic data on a day immediately before a forecasting day of the first characteristic information to the historical characteristic data in the at least one computation period of the first characteristic information.

Specifically, the pre-estimation apparatus obtains daily characteristic values in at least one computation period of each of the multiple pieces of first characteristic information corresponding to the pre-estimation model, in order to determine the historical characteristic data and the current incremental data in at least one computation period of each of the multiple pieces of first characteristic information corresponding to the pre-estimation model.

Preferably, the method according to the present invention may determine the pre-estimation model by step S4 (not shown), step S5 (not shown), and step S6 (not shown).

At step S4, the pre-estimation apparatus obtains the historical characteristic data in a historical time period and the corresponding incremental information of at least one of the multiple pieces of first characteristic information.

The historical time period includes at least one computation period.

Next, at step S5, the pre-estimation apparatus obtains daily characteristic values of the second characteristic information between the present time and an initial point of the historical time period.

Next, at step S6, the pre-estimation apparatus determines the pre-estimation model for forecasting the characteristic value on the next day of the second characteristic information based on the historical characteristic data in the historical time period and the corresponding incremental information of at least one of the multiple pieces of first characteristic information and the obtained daily characteristic values of the second characteristic information.

Preferably, the pre-estimation apparatus may determine the pre-estimation model by using a regressive analytical method, for example, vector regression, random forest, linear regression, based on the historical characteristic data in the historical time period and the corresponding incremental information of at least one of the multiple pieces of first characteristic information and the obtained daily characteristic values of the second characteristic information.

According to a first example of the present invention, in a system for providing advertisement promotion services to a user, the second characteristic information is a consumption value of the user, the length of the predetermined historical time period is 7 days, the forecasting day is the $x^{th}$ day, and the present day is the $x-1^{th}$ day. The first characteristic information establishing a pre-estimation model model_1 includes: the bid of a keyword, the click count of the advertisement corresponding to the keyword, the number of time periods and the number of areas for delivering the advertisement corresponding to the keyword. The pre-estimation apparatus obtains, at step S4, the average value of each of the first characteristic information "bid," "click count," "number of time periods" and "number of areas" between the $x-2^{th}$ day and the $x-8^{th}$ day, and the incremental information corresponding to each of the first characteristic information, respectively. Moreover, the pre-estimation apparatus obtains, at step S5, daily characteristic values of the second characteristic information "consumption value" between the $x-1^{th}$ day and the $x-8^{th}$ day. Next, the pre-estimation apparatus obtains a pre-estimation model model_1 for predicting the consumption value of the $x^{th}$ day based on the historical characteristic data of each of the first characteristic information between the $x-2^{th}$ day and the $x-8^{th}$ day, the respective corresponding incremental information and the characteristic value $S_{x-1}$ of the second characteristic information, i.e. consumption value, on the $x-1^{th}$ day.

Similarly, when the second characteristic information is "click count" and the first characteristic information is "bid," "consumption value," "number of time periods," and "number of areas," the pre-estimation apparatus obtains a pre-estimation model model_2 for forecasting the click count of the $x^{th}$ day by performing the above-mentioned steps S4 and S5.

It should be noted that the above example is provided only for better description of the technical solution of the present invention, but not to limit the present invention. Those skilled in the art will appreciate that any implementation of determining the pre-estimation model for forecasting the characteristic value on the next day of the second characteristic information based on the historical characteristic data in the historical time period and the corresponding incremental information of at least one of the multiple pieces of first characteristic information and the obtained daily characteristic values of the second characteristic information should be included within the scope of the present invention.

Next, at step S2, the pre-estimation apparatus obtains first change information on the forecasting day of the second characteristic information. The first change information on the forecasting day of the second characteristic information is determined by a forecasting process using the pre-estimation model based on the historical characteristic data of each of the multiple pieces of first characteristic information corresponding to the pre-estimation model and the current incremental data.

The first change information includes, but is not limited to, the pre-estimated characteristic value on the forecasting day of the second characteristic information to be predicted.

More preferably, the first change information further includes other information indicating the change of the pre-estimated characteristic value of the second characteristic information with respect to a previous characteristic value, for example, information indicating a change trend of the pre-estimated characteristic value of the second characteristic information with respect to the previous characteristic value, etc.

Continuing with the description of the afore-mentioned first example, the length of a computation period is 7 days, and the forecasting day is the $x^{th}$ day. The pre-estimation apparatus obtains, at step S1, the average values between the $x-1^{th}$ day and the $x-7^{th}$ day of each of the multiple pieces of first characteristic information "bid," "click count," "number of time periods," and "number of areas" based on the determined pre-estimation model model_1: price_e, click_e, time_e, and area_e, and determines current incremental data of each of the multiple pieces of first characteristic information: price_0/price_e, click_0/click_e, time_0/time_e, and area_0/area_e based on the characteristic values of respective pieces of first characteristic information on the $x-1^{th}$ day: price_0, click_0, time_0, and area_0. Next, the pre-estimation apparatus obtains a pre-estimated consumption value $S_x$ on the $x^{th}$ day of the second characteristic information "consumption value" which is determined by a forecasting process using the pre-estimation model based on the average values and the current incremental data of each of the multiple pieces of first characteristic information.

Similarly, the pre-estimation apparatus obtains the average values between the $x-1^{th}$ day and the $x-7^{th}$ day of the first characteristic information "bid," "consumption value," "number of time periods," and "number of areas": price_e, cost_e, time_e and area_e, and the corresponding current incremental data of the multiple pieces of first characteristic information: price_0/price_e, cost_0/cost_e, time_0/time_e, and area_0/area_e, based on the determined pre-estimation model model_2. Next, the pre-estimation apparatus obtains a pre-estimated click count $C_x$ on the $x^{th}$ day of the second characteristic information "click count" which is determined by a forecasting process using the pre-estimation model model_2 based on the average values and the current incremental data of each of the multiple pieces of first characteristic information.

Next, at step S3, the pre-estimation apparatus determines change pre-estimation information on the forecasting day of the second characteristic information based on the first change information in order to prompt a user to execute a corresponding operation based on the change pre-estimation information.

Preferably, the change pre-estimation information includes, but is not limited to, a final pre-estimation value of the second characteristic information.

More preferably, the change pre-estimation information further comprises other information indicating the change of the final pre-estimation value of the second characteristic information with respect to the previous characteristic value, for example, information indicating the change trend of the final pre-estimation value of the second characteristic information with respect to the previous characteristic value.

Specifically, the pre-estimation apparatus determines the change pre-estimation information on the forecasting day of the second characteristic information based on the first change information in order to prompt the user to execute the corresponding operation based on the change pre-estimation information in a mode which includes any one of the following:

1) The first change information is directly used as the change pre-estimation information of the forecasting day.

Continuing with the description of the afore-mentioned first example, the pre-estimation apparatus uses the pre-estimated consumption value $S_x$ and the pre-estimated click count $C_x$ as the change pre-estimation information of the $x^{th}$ day in order to prompt the user to execute corresponding operations based on the change pre-estimation information, for example, prompting the user to recharge in time, or recommending a suitable consumption plan to the current user.

2) The pre-estimation apparatus first determines the second change information on the forecasting day of the second characteristic information based on the historical characteristic value of the second characteristic information. Next, the pre-estimation apparatus determines the change pre-estimation information on the forecasting day of the second characteristic information based on the first change information and the second change information in order to prompt the user to execute corresponding operations based on the change pre-estimation information.

The second consumption information is for indicating the pre-estimated value of the second characteristic information which is determined based on the historical characteristic value of the second characteristic information.

Preferably, the pre-estimation apparatus uses the average value of the historical characteristic values within a past time period as the second change information of the forecasting day.

More preferably, if the $n^{th}$ day after the present day is the forecasting day, the pre-estimation apparatus may determine the second change information on the forecasting day of the second characteristic information based on the following equation (1):

$$sn = s1 * \frac{swn}{sw1} \quad (1)$$

where sn denotes the second change information on the $n^{th}$ day of the second characteristic information, s1 denotes a characteristic value on the $1^{st}$ day after the current time of the second characteristic information, s1 is equal to the average value of the historical characteristic values of the past 7 days, wn denotes the sequential number of the $n^{th}$ day within a period (for example, if a computation period has 7 days, the sequential number of the $1^{st}$ day within the period is 1, the sequential number of the $2^{nd}$ day within the period is 2, . . . , and so forth, the sequential number of the $7^{th}$ day is 7); and swn denotes the average value of the historical characteristic values of all days with the sequential number w1 in the past multiple computation periods.

Next, after obtaining the first change information and the second change information of the second characteristic information, the pre-estimation apparatus processes the first change information and the second change information according to a predetermined processing rule, in order to obtain the change pre-estimation information on the forecasting day of the second characteristic information.

Preferably, the pre-estimation apparatus uses the sum of the first change information and the second change information of the second characteristic information as the change pre-estimation information on the forecasting day of the second characteristic information, in order to prompt the user to execute corresponding operations based on the change pre-estimation information.

More preferably, the pre-estimation apparatus also obtains weights for the first change information and the second change information, respectively, in order to use the weighted sum of the first change information and the second change information as the change pre-estimation information on the forecasting day of the second characteristic information, thereby prompting the user to execute corresponding operations based on the change pre-estimation information.

It should be noted that the above example is provided only for better description of the technical solution of the present invention, but is not intended to limit the present invention. Those skilled in the art will appreciate that any implementation of determining the change pre-estimation information on the forecasting day of the second characteristic information based on the first change information and the second change information to prompt a user to execute a corresponding operation based on the change pre-estimation information should be included within the scope of the present invention.

Preferably, after determining the change pre-estimation information on the forecasting day of the second characteristic information, the pre-estimation apparatus may use the change pre-estimation information of the forecasting day as the historical characteristic value of the second characteristic information, and the next day after the forecasting day as a new forecasting day. The pre-estimation apparatus may determine the change pre-estimation information on the new forecasting day of the second characteristic information by repeating steps S1 to S3. Similarly, the pre-estimation apparatus may repeat steps S1 to S3 for many times to determine the change pre-estimation information of a plurality of days in the future.

According to a preferred embodiment of the present invention, the method further comprises step S7 (not shown).

At step S7, when an updating operation of the user on at least one of the multiple pieces of first characteristic information corresponding to the pre-estimation model is obtained, the pre-estimation apparatus updates the current incremental data of at least one of the first characteristic information based on the updating operation, in order to obtain the updated pre-estimation model.

The updating operation includes various operations which cause changes in the characteristic value of the first characteristic information.

Continuing with the description of the afore-mentioned first example, for example, if the pre-estimation apparatus obtains the modification of the value of the first characteristic information "bid" from price_0 to price_1 from the user, the pre-estimation apparatus updates the current incremental data of the first characteristic information "bid" from price_0/price_e to price_1/price_e based on the average value price_e of the "bid" within 7 days from the past x–$1^{th}$ day to x–$7^{th}$ day, so that the pre-estimation model model_1 may perform the forecasting process based on the current incremental data of the updated "bid."

It should be noted that the above example is provided only for better description of the technical solution of the present invention, but is not intended to limit the present invention. Those skilled in the art will appreciate that any implementation of updating, when an updating operation of the user on at least one of the multiple pieces of first characteristic information corresponding to the pre-estimation model is obtained, respective current incremental data of at least one of the multiple pieces of first characteristic information based on the updating operation in order to obtain the updated pre-estimation model should be included within the scope of the present invention.

Preferably, the method according to the present invention may further comprise step S8 (not shown), and step S3 may comprise step S301 (not shown).

At step S8, the pre-estimation apparatus obtains a pre-estimation presentation instruction of the current user.

Preferably, the pre-estimation presentation instruction includes, but is not limited to, any one of the following:

1) When the second characteristic information exists, the change pre-estimation information of at least one among the second characteristic information as selected is presented.

For example, the pre-estimation apparatus display two pieces of the second characteristic information "consumption value" and "search volume" that can be forecasted, and obtains the user's selection of the change pre-estimation information of the first characteristic information "consumption value."

2) Presentation mode of the change pre-estimation information: for example, presentation in a curve diagram, presentation in the form of a data list, etc.

3) The time period of the presented change pre-estimation information: for example, one week or one month in the future, etc. Preferably, the user may select any day or several days as the time period for presenting the change pre-estimation information.

Next, at step S301, the pre-estimation apparatus presents at least one of the change pre-estimation information corresponding to the pre-estimation presentation instruction according to the pre-estimation presentation instruction.

For example, the pre-estimation presentation instruction of the current user obtained by the pre-estimation apparatus comprises: presenting characteristic values in the past 10 days of the consumption value and the change pre-estimation information in the next 10 days; presenting in the form of a curve diagram. Then, the pre-estimation apparatus obtains information corresponding to the pre-estimation presentation instruction from the historical characteristic values of the obtained second characteristic information, and obtains the change pre-estimation information in the next 10 days of the second characteristic information "consumption value" by repeating steps S1 to S3 for several times, and presents the change pre-estimation information in the next 10 days of the second characteristic information "consumption value" in the form of a curve diagram, in order to display the curve diagram as shown in FIG. 3 to the user.

According to a further preferred embodiment of the present invention, the method according to the present embodiment further comprises step S9 (not shown), step S10 (not shown), and step S11 (not shown).

At step S9, the pre-estimation apparatus identifies, for a plurality of users, the change pre-estimation information of at least one of the multiple pieces of second characteristic information in a predetermined time period.

At step S10, the pre-estimation apparatus fits respective change pre-estimation information of the plurality of users and the change pre-estimation information in the predefined time period of the current user in order to determine at least one similar user of the current user based on the result of the fitting.

At step S11, the pre-estimation apparatus determines a characteristic update plan to be recommended to the current user based on a characteristic update plan of the at least one similar user corresponding to the second characteristic information. For example, the pre-estimation apparatus performs a fitting operation on the obtained curves of the change pre-estimation information of the "consumption value" of multiple users within a certain future period, in order to obtain a user matching the current user most, and obtains a consumption plan within the next 5 days of the user (i.e., a characteristic update plan corresponding to the first characteristic information) in order to recommend the consumption plan to the current user.

Preferably, the method according to the present invention further comprises step S12 (not shown).

At step S12, the pre-estimation apparatus judges whether the change pre-estimation information satisfies a predetermined prompting condition, and when the change pre-estimation information satisfies the predetermined prompting condition, transmits corresponding prompt information to a current user in order to prompt the user to execute the corresponding operation.

For example, the change pre-estimation information includes a pre-estimated characteristic value of the consumption value of the user. The predetermined prompting condition includes the account balance on the forecasting day being less than 1000 CNY. The user's current account balance is 1500 CNY, and the pre-estimation apparatus obtains, by executing the above steps S1 to S3, that the pre-estimated characteristic value of the consumption value on the forecasting day is 820 CNY, then the pre-estimation apparatus determines based on the change pre-estimation value that the account balance of the user on the forecasting day is 680 CNY. The pre-estimation apparatus judges that the account balance corresponding to the change forecasting value satisfies the predetermined prompting condition, and sends the current user a piece of prompt information "Insufficient balance, please timely top-up" in order to prompt the current user to perform the account recharging operation.

Preferably, the method according to the present invention further comprises step S13 (not shown) and step S14 (not shown).

At step S13, the pre-estimation apparatus obtains the change pre-estimation information of at least one of the multiple pieces of second characteristic information respectively corresponding to one or more users.

Specifically, the pre-estimation apparatus obtains, by performing steps S1 to step S3 for at least one time for one or more users, the change pre-estimation information of at least one of the multiple pieces of second characteristic information respectively corresponding to each users. Additionally or alternatively, the pre-estimation apparatus receives, from other pre-estimation apparatuses, the change pre-estimation information of at least one of the multiple pieces of second characteristic information corresponding to one or more users, respectively.

Next, at step S14, the pre-estimation apparatus performs statistics on the obtained change pre-estimation information of at least one of the multiple pieces of second characteristic information corresponding to each user, in order to adjust a corresponding service resource configuration based on the statistical result.

The resource includes various kinds of software and hardware resources required for providing a service related to the characteristic information. For example, the service resources include the size of the available bandwidth, the number of available servers, etc.

For example, the second characteristic information includes "search volume," at step S13, the pre-estimation apparatus receives, from a plurality of other pre-estimation apparatuses, the change pre-estimation information of the search volume of each of the users corresponding to each of the plurality of other pre-estimation apparatuses within the next period; and obtain the change pre-estimation information of the search volume corresponding to the current user within the next period by executing respective steps. The pre-estimation apparatus then performs statistics on the obtained change pre-estimation information of the search volumes corresponding to each of the users to obtain the each user's sum of the daily average search volumes in the next week, and if the sum of the daily average search volumes in the next week exceeds a predetermined threshold, a backup server for providing a search service is enabled within the next time period, in order to enhance the throughput of the search service within this time period.

According to the method of the present invention, a pre-estimation model for forecasting the second characteristic information is established based on the first characteristic information, thereby effectively reflecting the mutual influential relationship between the individual characteristic information, facilitating the user's understanding of the future trend in the change of the characteristic information by pre-estimation based on the pre-estimation model the corresponding characteristic information within a certain future period, and enhancing user experience by performing corresponding operations based on the presented pre-estimation information. Moreover, through the pre-estimation in conjunction with the operation performed by the user the characteristic value in a certain future period of the second characteristic information, the accuracy of the pre-estimation information is further enhanced, a desire of the user to understand the characteristic information change in the future is met, and the pre-estimation accuracy is enhanced. In addition, according to the method of the present invention, the corresponding resource configuration can be adjusted based on the result of the pre-estimation such that the global service resource can be more effectively utilized, thereby the service corresponding to each of the characteristic information is better supported.

FIG. 2 schematically shows a structural diagram of a pre-estimation apparatus for forecasting the characteristic information change according to the present invention. The pre-estimation apparatus according to the present invention comprises: means for acquiring historical characteristic data in at least one computation period and current incremental data of first characteristic information corresponding to a pre-estimation model (hereinafter referred to as "acquiring means", 1), means for obtaining first change information on the forecasting day of second characteristic information (hereinafter referred to as "obtaining means", 2), wherein the first change information on the forecasting day of the second characteristic information is determined by a forecasting process using the pre-estimation model based on the historical characteristic data and the current incremental data of each of the multiple pieces of first characteristic information corresponding to the pre-estimation model; and means for determining, based on the first change information, change pre-estimation information on the forecasting day of the second characteristic information in order to prompt a user to execute a corresponding operation based on the change pre-estimation information (hereinafter referred to as "determining means", 3).

With reference to FIG. 2, the acquiring means acquires historical characteristic data in at least one computation period and current incremental data of multiple pieces of first characteristic information corresponding to a pre-estimation model.

The pre-estimation model includes, but is not limited to, a model established based on at least one of the multiple pieces of first characteristic information and for forecasting the change of second characteristic information.

Preferably, the pre-estimation model may be implemented by machine learning. The pre-estimation apparatus obtains the first characteristic information and the second characteristic information in a mode which includes, but is not limited to, any one of the following:

1) Among multiple pieces of characteristic information, one of the multiple pieces of characteristic information is predetermined as the second characteristic information to be predicted, while the remaining pieces of characteristic information is used as the first characteristic information.

For example, "consumption value" is predetermined as the second characteristic information to be predicted, while the remaining characteristic information "search volume," "ranking" is used as the first characteristic information required for establishing the pre-estimation model for predicting the second characteristic information.

2) The obtaining means 1 selects, based on the user's operation, one of the multiple pieces of characteristic information as the second characteristic information, and selects at least one of the remaining pieces of characteristic information as the first characteristic information.

The historical characteristic data includes period average values of characteristic values of the individual characteristic information within each computation period.

Preferably, when a plurality of computation periods are involved, the obtaining means 1 may first obtain a plurality of period average values of the characteristic data within each computation period of the first characteristic information, and then compute a secondary average value of the plurality of period average values based on the obtained period average values, and use the secondary average value as the historical characteristic data of the first characteristic information with respect to the plurality of computation periods.

Those skilled in the art may select or determine the length of the computation period based on the actual conditions and requirements, for example, designating 7 days as a computation period, designating one month as a computation period, etc.

The current incremental data are used for indicating a ratio of first characteristic data on a day immediately before a forecasting day of the first characteristic information to the historical characteristic data in the at least one computation period of the first characteristic information.

Specifically, the obtaining means 1 obtains daily characteristic values in at least one computation period of each of the first characteristic information corresponding to the pre-estimation model, in order to determine the historical characteristic data and the current incremental data of each of the first characteristic information corresponding to the pre-estimation model in at least one computation period.

Preferably, the pre-estimation apparatus according to the present invention may determine the pre-estimation model by the following means: means for acquiring the historical characteristic data in a historical time period and the corresponding incremental information of at least one of the first characteristic information (not shown, hereinafter referred to as "first sub-obtaining means"), means for obtaining daily characteristic values of the second characteristic information between the present time and an initial point of the historical time period (not shown, hereinafter referred to as "second sub-obtaining means"), and means for determining the pre-estimation model for forecasting the characteristic value on the next day of the second characteristic information based on the historical characteristic data in the historical time period and the corresponding incremental information of at least one of the first characteristic information and the obtained daily characteristic values of the second characteristic information (not shown, hereinafter referred to as "sub-determining means").

The first sub-acquiring means obtains the historical characteristic data in the historical time period and the corresponding incremental information of at least one of the first characteristic information.

The historical time period includes at least one computation period.

Next, the second sub-acquiring means obtains daily characteristic values of the second characteristic information between the present time and an initial point of the historical time period.

Next, the sub-determining means determines the pre-estimation model for forecasting the characteristic value on the next day of the second characteristic information based on the historical characteristic data in the historical time period and the corresponding incremental information of at least one of the multiple pieces of first characteristic information and the obtained daily characteristic values of the second characteristic information.

Preferably, the pre-estimation apparatus may determine the pre-estimation model by using a regressive analytical method, for example vector regression, random forest, linear regression, based on the historical characteristic data in the historical time period and the corresponding incremental information of at least one of the multiple pieces of first characteristic information and the obtained daily characteristic values of the second characteristic information.

According to a first example of the present invention, in a system for providing advertisement promotion services to a user, the second characteristic information is a consumption value of the user, the length of the predetermined historical time period is 7 days, the forecasting day is the $x^{th}$ day, and the present day is the $x-1^{th}$ day. The first characteristic information establishing a pre-estimation model model_1 includes: the bid of a keyword, the click count of the advertisement corresponding to the keyword, the number of time periods and the number of areas for delivering the advertisement corresponding to the keyword. The first sub-acquiring means obtains the average value of each of the multiple pieces of first characteristic information "bid," "click count," "number of time periods" and "number of areas" between the $x-2^{th}$ day and the $x-8^{th}$ day, and the incremental information corresponding to each of the multiple pieces of first characteristic information, respectively. Moreover, the second sub-acquiring means obtains daily characteristic values of the second characteristic information "consumption value" between the $x-1^{th}$ day and the $x-8^{th}$ day. Next, the sub-determining means obtains a pre-estimation model model_1 for predicting the consumption value of the $x^{th}$ day based on the historical characteristic data of each of the multiple pieces of first characteristic information between the $x-2^{th}$ day and the $x-8^{th}$ day, the respective corresponding incremental information and the characteristic value $S_{x-1}$ of the second characteristic information, i.e. consumption value, on the $x-1^{th}$ day.

Similarly, when the second characteristic information is "click count" and the first characteristic information is "bid," "consumption value," "number of time periods," and "number of areas," the pre-estimation apparatus obtains a pre-estimation model mdel_2 for forecasting the click count of the $x^{th}$ day through the first sub-acquiring means and the second sub-acquiring means.

It should be noted that the above example is provided only for better description of the technical solution of the present invention, but not to limit the present invention. Those skilled in the art will appreciate that any implementation of determining the pre-estimation model for forecasting the characteristic value on the next day of the second characteristic information based on the historical characteristic data in the historical time period and the corresponding incremental information of at least one of the multiple pieces of first characteristic information and the obtained daily characteristic values of the second characteristic information should be included within the scope of the present invention.

Next, the obtaining means 2 obtains first change information on the forecasting day of second characteristic information. The first change information on the forecasting day of the second characteristic information is determined by a forecasting process using the pre-estimation model based on the historical characteristic data of each of the multiple pieces of first characteristic information corresponding to the pre-estimation model and the current incremental data.

The first change information includes, but is not limited to, the pre-estimated characteristic value on the forecasting day of the second characteristic information to be predicted.

More preferably, the first change information further includes other information indicating the change of the pre-estimated characteristic value of the second characteristic information with respect to a previous characteristic value, for example, information indicating a change trend of the pre-estimated characteristic value of the second characteristic information with respect to the previous characteristic value, etc.

Continuing with the description of the above-mentioned first example, the length of a computation period is 7 days, and the forecasting day is the $x^{th}$ day. The obtaining means 1 obtains the average values between the $x-1^{th}$ day and the $x-7^{th}$ day of each of the multiple pieces of first characteristic information "bid," "click count," "number of time periods," and "number of areas" based on the determined pre-estimation model model_1: price_e, click_e, time_e, and area_e, and determines current incremental data of each of the multiple pieces of first characteristic information: price_0/price_e, click_0/click_e, time_0/time_e, and area_0/area_e based on the characteristic values of respective first characteristic information on the x–1$^{th}$ day: price_0, click_0, time_0, and area_0. Next, the second obtaining means 2 obtains a pre-estimated consumption value $S_x$ on the x$^{th}$ day of the second characteristic information "consumption value" which is determined by a forecasting process using the pre-estimation model based on the average values and the current incremental data of each of the multiple pieces of first characteristic information.

Similarly, the obtaining means 1 obtains the average values between the x–1$^{th}$ day and the x–7$^{th}$ day of the first characteristic information "bid," "consumption value," "number of time periods," and "number of areas": price_e, cost_e, time_e and area_e, and the corresponding current incremental data of the first characteristic information: price_0/price_e, cost_0/cost_e, time_0/time_e, and area_0/area_e, based on the determined pre-estimation model model_2. Next, the second obtaining means 2 obtains a pre-estimated click count $C_x$ on the x$^{th}$ day of the second characteristic information "click count" which is determined by a forecasting processing by using the pre-estimation model model_2 based on the average values and the current incremental data of each of the multiple pieces of first characteristic information.

Next, the determining means 3 determines change pre-estimation information on the forecasting day of the second characteristic information based on the first change information in order to prompt a user to execute a corresponding operation based on the change pre-estimation information.

Preferably, the change pre-estimation information includes, but is not limited to, a final pre-estimation value of the second characteristic information.

More preferably, the change pre-estimation information further comprises other information indicating the change of the final pre-estimation value of the second characteristic information with respect to the previous characteristic value, for example, information indicating the change trend of the final pre-estimation value of the second characteristic information with respect to the previous characteristic value.

Specifically, the determining means 3 determines the change pre-estimation information on the forecasting day of the second characteristic information based on the first change information in order to prompt the user to execute the corresponding operation based on the change pre-estimation information in a mode which includes any one of the following:

1) The first change information is directly used as the change pre-estimation information of the forecasting day.

Continuing with the description of the above-mentioned first example, the determining means 3 uses the pre-estimated consumption value $S_x$ and the pre-estimated click count $C_x$ as the change pre-estimation information of the x$^{th}$ day in order to prompt the user to execute corresponding operations based on the change pre-estimation information, for example, prompting the user to recharge in time, or recommending a suitable consumption plan to the current user.

2) The pre-estimation apparatus further comprises: means for determining the second change information on the forecasting day of the second characteristic information based on the historical characteristic value of the second characteristic information (not shown, hereinafter referred to as "third obtaining means"). The determining means 3 further comprises means for determining the change pre-estimation information on the forecasting day of the second characteristic information based on the first change information and the second change information in order to prompt the user to execute corresponding operations based on the change pre-estimation information (not shown, hereinafter referred to as "sub-determining means").

The second consumption information is for indicating the pre-estimated value of the second characteristic information which is determined based on the historical characteristic value of the second characteristic information.

Preferably, the third obtaining means uses the average value of the historical characteristic values within a past time period as the second change information of the forecasting day.

More preferably, if the n$^{th}$ day after the present day is the forecasting day, the third obtaining means may determine the second change information on the forecasting day of the second characteristic information based on the following equation (1):

$$sn = s1 * \frac{swn}{sw1} \qquad (1)$$

where sn denotes the second change information on the n$^{th}$ day of the second characteristic information, s1 denotes a characteristic value on the 1$^{th}$ day after the current time of the second characteristic information, s1 is equal to the average value of the historical characteristic values of the past 7 days, wn denotes the sequential number of the n$^{th}$ day within a period (for example, if a computation period has 7 days, the sequential number of the 1$^{th}$ day within the period is 1, the sequential number of the 2$^{th}$ day within the period is 2, . . . , and so forth, the sequential number of the 7$^{th}$ day is 7); and swn denotes the average value of the historical characteristic values of all days with the sequential number w1 in the past multiple computation periods.

Next, after obtaining the first change information and the second change information of the second characteristic information, the sub-determining means processes the first change information and the second change information according to a predetermined processing rule, in order to obtain the change pre-estimation information on the forecasting day of the second characteristic information.

Preferably, the sub-determining means uses the sum of the first change information and the second change information of the second characteristic information as the change pre-estimation information on the forecasting day of the second characteristic information, in order to prompt the user to execute corresponding operations based on the change pre-estimation information.

More preferably, the sub-determining means also obtains weights for the first change information and the second change information, respectively, in order to use the weighted sum of the first change information and the second change information as the change pre-estimation information on the forecasting day of the second characteristic information, thereby prompting the user to execute corresponding operations based on the change pre-estimation information.

It should be noted that the above example is provided only for better description of the technical solution of the present invention, but is not intended to limit the present invention.

Those skilled in the art will appreciate that any implementation of determining the change pre-estimation information on the forecasting day of the second characteristic information based on the first change information and the second change information to prompt a user to execute a corresponding operation based on the change pre-estimation information should be included within the scope of the present invention.

Preferably, after determining the change pre-estimation information on a forecasting day of the second characteristic information, the determining means 3 may use the change pre-estimation information of the forecasting day as the historical characteristic value of the second characteristic information, and the next day after the forecasting day as a new forecasting day. The determining means 3 may determine the change pre-estimation information on the new forecasting day of the second characteristic information by repeating the operation of obtaining the historical characteristic data in at least one computation period and the current incremental data of the first characteristic information corresponding to the pre-estimation model to the operation of determining the change pre-estimation information on the forecasting day of the second characteristic information based on the first change information. Similarly, the pre-estimation apparatus may repeat the operation of obtaining the historical characteristic data in at least one computation period and the current incremental data of the first characteristic information corresponding to the pre-estimation model to the operation of determining the change pre-estimation information on the forecasting day of the second characteristic information based on the first change information many times to determine the change pre-estimation information of a plurality of days in the future.

According to a preferred embodiment of the present invention, the pre-estimation apparatus further comprises means for, when an updating operation of the user on at least one of the multiple pieces of first characteristic information corresponding to the pre-estimation model is obtained, updating the current incremental data of at least one of the multiple pieces of first characteristic information based on the updating operation, in order to obtain the updated pre-estimation model (not shown, hereinafter referred to as "characteristic updating means").

When an updating operation of the user on at least one of the multiple pieces of first characteristic information corresponding to the pre-estimation model is obtained, the characteristic updating means updates the current incremental data of at least one of the multiple pieces of first characteristic information based on the updating operation, in order to obtain the updated pre-estimation model.

The updating operation includes various operations changing the characteristic value of the first characteristic information.

Continuing with the description of the afore-mentioned first example, for example, if the pre-estimation apparatus obtains the modification of the value of the first characteristic information "bid" from price_0 to price_1 by the user, the pre-estimation apparatus updates the current incremental data of the first characteristic information "bid" from price_0/price_e to price_1/price_e based on the average value price_e of the "bid" within 7 days from the past $x-1^{th}$ day to $x-7^{th}$ day, so that the pre-estimation model model_1 may perform the forecasting processing based on the current incremental data of the updated "bid."

It should be noted that the above example is provided only for better description of the technical solution of the present invention, but is not intended to limit the present invention.

Those skilled in the art will appreciate that any implementation of updating, when an updating operation of the user on at least one of the multiple pieces of first characteristic information corresponding to the pre-estimation model is obtained, respective current incremental data of at least one of the multiple pieces of first characteristic information based on the updating operation in order to obtain the updated pre-estimation model should be included within the scope of the present invention.

Preferably, the pre-estimation apparatus based on the present invention may further comprise means for obtaining a pre-estimation presentation instruction of the current user (not shown, hereinafter referred to as "instruction obtaining means"). The determining means 3 further comprises means for presenting at least one of the change pre-estimation information corresponding to the pre-estimation presentation instruction according to the pre-estimation presentation instruction (not shown, hereinafter referred to as "presenting means").

The instruction obtaining means obtains a pre-estimation presentation instruction of the current user.

Preferably, the pre-estimation presentation instruction includes, but is not limited to, any one of the following:

1) When the second characteristic information exists, the change pre-estimation information of at least one among the second characteristic information as selected is presented.

For example, the pre-estimation apparatus display two pieces of second characteristic information "consumption value" and "search volume" that can be forecasted, and obtains the user's selection of the change pre-estimation information of the first characteristic information "consumption value."

2) Presentation mode of the change pre-estimation information: for example, presentation in a curve diagram, presentation in the form of a data list, etc.;

3) The time period of the presented change pre-estimation information; for example, one week or one month in the future, etc. Preferably, the user may select any day or several days as the time period for presenting the change pre-estimation information.

Next, the presenting means presents at least one of the change pre-estimation information corresponding to the pre-estimation presentation instruction according to the pre-estimation presentation instruction.

For example, the pre-estimation presentation instruction of the current user obtained by the instruction obtaining means comprises: presenting characteristic values in the past 10 days of the consumption value and the change pre-estimation information in the next 10 days; presenting in the form of a curve diagram. Then, the presenting means obtains information corresponding to the pre-estimation presentation instruction from the historical characteristic values of the obtained second characteristic information, and obtains the change pre-estimation information in the next 10 days of the second characteristic information "consumption value" by repeating the operation of obtaining the historical characteristic data in at least one computation period and the current incremental data of the first characteristic information corresponding to the pre-estimation model to the operation of determining the change pre-estimation information on the forecasting day of the second characteristic information based on the first change information for many times, and presents the change pre-estimation information in the next 10 days of the second characteristic information "consumption value" in the form of a curve diagram, in order to display the curve diagram as shown in FIG. 3 to the user.

According to a further preferred embodiment of the present invention, the pre-estimation apparatus according to the present embodiment further comprises means for identifying, for a plurality of users, the change pre-estimation information of at least one of the multiple pieces of second characteristic information in a predetermined time period (not shown, hereinafter referred to as "predetermining means"); means for fitting respective change pre-estimation information of the plurality of users and the change pre-estimation information in the predefined time period of the current user in order to determine at least one similar user of the current user based on the result of the fitting (not shown, hereinafter referred to as "fitting means"); and means for determining a characteristic update plan to be recommended to the current user based on a characteristic update plan of the at least one similar user corresponding to the second characteristic information (not shown, hereinafter referred to as "plan recommending means").

The predetermining means identifies, for a plurality of users, the change pre-estimation information of at least one of the multiple pieces of second characteristic information in a predetermined time period.

Next, the fitting means fits respective change pre-estimation information of the plurality of users and the change pre-estimation information in the predefined time period of the current user in order to determine at least one similar user of the current user based on the result of the fitting.

Then, the plan recommending means determines a characteristic update plan to be recommended to the current user based on a characteristic update plan of the at least one similar user corresponding to the second characteristic information.

For example, the fitting means performs a fitting operation on the obtained curves of the change pre-estimation information of the "consumption value" of multiple users within a certain future period, in order to obtain a user matching the current user most, and obtains a consumption plan within the next 5 days of the user (i.e., a characteristic update plan corresponding to the first characteristic information) in order to recommend the consumption plan to the current user.

Preferably, the pre-estimation apparatus according to the present invention further comprises means for judging whether the change pre-estimation information satisfies a predetermined prompting condition, and when the change pre-estimation information satisfies the predetermined prompting condition, transmits corresponding prompt information to a current user in order to prompt the user to execute the corresponding operation (not shown, hereinafter referred to as "prompting means").

The prompting means judges whether the change pre-estimation information satisfies a predetermined prompting condition, and when the change pre-estimation information satisfies the predetermined prompting condition, transmits corresponding prompt information to a current user in order to prompt the user to execute the corresponding operation.

For example, the change pre-estimation information includes a pre-estimated characteristic value of the consumption value of the user. The predetermined prompting condition includes the account balance on the forecasting day being less than 1000 CNY. The user's current account balance is 1500 CNY, and the pre-estimation apparatus obtains, by executing the above steps S1 to S3, that the pre-estimated characteristic value of the consumption value on the forecasting day is 820 CNY, then the pre-estimation apparatus determines based on the change pre-estimation value that the account balance of the user on the forecasting day is 680 CNY. The prompting means judges that the account balance corresponding to the change forecasting value satisfies the predetermined prompting condition, and sends the current user a piece of prompt information "Insufficient balance, please timely top-up" in order to prompt the current user to perform the account recharging operation.

Preferably, the pre-estimation apparatus according to the present invention further comprises means for obtaining the change pre-estimation information of at least one of the multiple pieces of second characteristic information respectively corresponding to one or more users (not shown, hereinafter referred to as "pre-estimation obtaining means") and means for counting the obtained change pre-estimation information of at least one of the multiple pieces of second characteristic information corresponding to each user, in order to adjust a corresponding service resource configuration based on the result of the counting (not shown, hereinafter referred to as "pre-estimation counting means").

The pre-estimation obtaining means obtains the change pre-estimation information of at least one of the multiple pieces of second characteristic information respectively corresponding to one or more users.

Specifically, the pre-estimation obtaining means obtains, by performing the operation of obtaining the historical characteristic data in at least one computation period and the current incremental data of the first characteristic information corresponding to the pre-estimation model to the operation of determining the change pre-estimation information on the forecasting day of the second characteristic information based on the first change information for at least one time for one or more users, the change pre-estimation information of at least one of the multiple pieces of second characteristic information respectively corresponding to each users. Additionally or alternatively, the pre-estimation obtaining means receives, from other pre-estimation apparatuses, the change pre-estimation information of at least one of the multiple pieces of second characteristic information respectively corresponding to one or more users.

Next, the pre-estimation counting means performs statistics on the obtained change pre-estimation information of at least one of the multiple pieces of second characteristic information corresponding to each user, in order to adjust a corresponding service resource configuration based on the statistical result.

The resource includes various kinds of software and hardware resources required for providing a service related to the characteristic information. For example, the service resources include the size of the available bandwidth, the number of available servers, etc.

For example, the second characteristic information includes "search volume." The pre-estimation obtaining means receives, from a plurality of other pre-estimation apparatuses, the change pre-estimation information within a next period of the search volume of each of the users corresponding to each of the plurality of other pre-estimation apparatuses; and obtain the change pre-estimation information of the search volume corresponding to the current user within the next period by executing respective steps. The pre-estimation counting means then performs statistics on the obtained change pre-estimation information of the search volumes corresponding to each of the users to obtain the each user's sum of the average search volumes per day in the next week, and if the sum of the daily average search volumes in the next week exceeds a predetermined threshold, a backup server for providing a search service is enabled within the next time period, in order to enhance the throughput of the search service within this time period.

According to the scheme of the present invention, a pre-estimation model for forecasting the second characteristic information is established based on the first characteristic information, thereby effectively reflecting the mutual influential relationship between individual characteristic information, facilitating the user's understanding of the future trend in the change of the characteristic information by pre-estimation based on the pre-estimation model the corresponding characteristic information within a certain future period, and enhancing user experience by performing corresponding operations based on the presented pre-estimation information. Moreover, through the pre-estimation in conjunction with the operation performed by the user the characteristic value in a certain future period of the second characteristic information, the accuracy of the pre-estimation information is further enhanced, a desire of the user to understand the characteristic information change in the future is met, and the pre-estimation accuracy is enhanced. In addition, according to the method of the present invention, the corresponding resource configuration can be adjusted based on the result of the pre-estimation such that the global service resource can be more effectively utilized, thereby the service corresponding to each of the characteristic information is better supported.

A software program according to the present invention may be executed by the processor to perform the above-mentioned steps or functions. Likewise, the software program (including relevant data structures) according to the present invention may be stored in a computer readable recording medium, for example, a RAM memory, a magnetic or optical-driver or a floppy disk and the like. Additionally, some steps or functions of the present invention may be implemented in hardware, for example, as a circuit cooperating with the processor to perform individual functions or steps.

Additionally, a part of the present invention may be implemented as a computer program product, for example, computer program instructions which, when executed by a computer, may invoke or provide a method and/or technical solution according to the present invention. The program instructions invoking the method according to the present invention may be stored in a fixed or removable recording medium, and/or transmitted by broadcasting or a data flow in other signal carrying media, and/or stored in a work memory of a computer device running according to the program instructions. Here, one embodiment according to the present invention comprises an apparatus that includes a memory storing computer program instructions and a processor executing the program instructions. The computer program instructions, when executed by the processor, trigger the apparatus to run the method and/or technical solution according to a plurality of embodiments of the present invention.

It should be apparent to those skilled in the art that the present invention is not limited to the details of the above exemplary embodiments, and the present invention may be implemented in other specific forms without departing from the spirit or basic characteristics of the present invention. Thus, the embodiments should be regarded exemplary and non-limiting in any aspect. The scope of the present invention is limited by the appended claims rather than the above depiction. Thus, it is intended that all variations within the meaning and scope of equivalents of the elements in the claims should be covered within the present invention. Reference numerals in the claims should not be regarded as limitation of the involved claims. In addition, it is apparent that the term "comprise" does not exclude other units or steps, and the singular forms do not exclude the plural forms. A plurality of units or means recited in a system claim may also be implemented by a single unit or means in software or hardware. Terms such as "first" and "second" are used to indicate names, but not to indicate any particular sequence.

The invention claimed is:

1. A method for forecasting a characteristic information change, the method comprising:
   acquiring historical characteristic data in at least one computation period and current incremental data of multiple pieces of first characteristic information corresponding to a pre-estimation model, wherein the current incremental data is used for indicating a ratio of characteristic data on a day immediately before a forecasting day of each of the multiple pieces of the first characteristic information to the historical characteristic data in the at least one computation period of each of the multiple pieces of first characteristic information;
   obtaining first change information on the forecasting day of second characteristic information, the first change information on the forecasting day of the second characteristic information being determined by a forecasting process using the pre-estimation model based on the historical characteristic data and the current incremental data of each of the multiple pieces of first characteristic information corresponding to the pre-estimation model; and
   determining, based on the first change information, change pre-estimation information on the forecasting day of the second characteristic information, to prompt a user to execute a corresponding operation based on the change pre-estimation information.

2. The method according to claim 1, further comprising:
   determining second change information on the forecasting day of the second characteristic information based on a historical characteristic value of the second characteristic information;
   wherein determining, based on the first change information, the change pre-estimation information on the forecasting day of the second characteristic information, to prompt the user to execute the corresponding operation based on the change pre-estimation information further comprises:
   determining the change pre-estimation information on the forecasting day of the second characteristic information based on the first change information and the second change information to prompt the user to execute the corresponding operation based on the change pre-estimation information.

3. The method according to claim 1, wherein the acquiring the current incremental data of the multiple pieces of first characteristic information corresponding to the pre-estimation model further comprises:
   when an updating operation of the user on at least one of the multiple pieces of first characteristic information corresponding to the pre-estimation model is obtained, updating the current incremental data of the at least one of the multiple pieces of first characteristic information based on the updating operation.

4. The method according to claim 1, further comprising:
   acquiring the historical characteristic data in a historical time period and corresponding incremental information of at least one of the multiple pieces of first characteristic information, the historical time period comprising at least one computation period;

obtaining daily characteristic values of the second characteristic information between a present time and an initial point of the historical time period; and determining the pre-estimation model based on the historical characteristic data in the historical time period and the corresponding incremental information of the at least one of the multiple pieces of first characteristic information and the obtained daily characteristic values of the second characteristic information, the pre-estimation model forecasting a characteristic value on a next day of the second characteristic information.

5. The method according to claim 1, further comprising:

selecting, based on an operation of a user, one of the multiple pieces of characteristic information as the second characteristic information, and selecting at least one of the remaining pieces of characteristic information as the first characteristic information required for establishing the pre-estimation model for predicting the second characteristic information.

6. The method according to claim 1, further comprising:

obtaining a pre-estimation presentation instruction of a current user, wherein determining, based on the first change information, the change pre-estimation information on the forecasting day of the second characteristic information in order to prompt the user to execute the corresponding operation according to the change pre-estimation information further comprises:

presenting at least one of the change pre-estimation information corresponding to the pre-estimation presentation instruction according to the pre-estimation presentation instruction.

7. The method according to claim 1, further comprising:

identifying, for a plurality of users, the change pre-estimation information of at least one of the second characteristic information in a predetermined time period;

fitting respective change pre-estimating information of the plurality of users and the change pre-estimation information in the predefined time period of a current user to determine at least one similar user of the current user based on a result of the fitting; and determining, based on a characteristic update plan of the at least one similar user, a characteristic update plan to be recommended to the current user.

8. The method according to claim 1, further comprising:

judging whether the change pre-estimation information satisfies a predetermined prompting condition, and when the change pre-estimation information satisfies the predetermined prompting condition, transmitting corresponding prompt information to a current user to prompt the user to execute the corresponding operation.

9. The method according to claim 1, wherein the method further comprises:

obtaining the change pre-estimation information of at least one of the second characteristic information respectively corresponding to one or more users;

performing statistics on the obtained change pre-estimation information of at least one of the second characteristic information corresponding to each of the one or more users, to adjust a corresponding service resource configuration based on a statistical result.

10. A pre-estimation apparatus for forecasting a characteristic information change, the apparatus comprising:

at least one processor; and a memory storing instructions, wherein the instructions when executed by the at least one processor, cause the at least one processor to perform operations, the operations comprising:

acquiring historical characteristic data in at least one computation period and current incremental data of multiple pieces of first characteristic information corresponding to a pre-estimation model, wherein the current incremental data is used for indicating a ratio of characteristic data on a day immediately before a forecasting day of each of the multiple pieces of the first characteristic information to the historical characteristic data in the at least one computation period of each of the multiple pieces of first characteristic information;

obtaining first change information on the forecasting day of second characteristic information, the first change information on the forecasting day of the second characteristic information being determined by a forecasting process using the pre-estimation model based on the historical characteristic data and the current incremental data of each of the multiple pieces of first characteristic information corresponding to the pre-estimation model; and determining, based on the first change information, change pre-estimation information on the forecasting day of the second characteristic information, to prompt a user to execute a corresponding operation based on the change pre-estimation information.

11. The pre-estimation apparatus according to claim 10, wherein the operations further comprise:

determining second change information on the forecasting day of the second characteristic information based on a historical characteristic value of the second characteristic information;

wherein the determining, based on the first change information, the change pre-estimation information on the forecasting day of the second characteristic information, to prompt the user to execute the corresponding operation based on the change pre-estimation information further comprises:

determining the change pre-estimation information on the forecasting day of the second characteristic information based on the first change information and the second change information to prompt the user to execute the corresponding operation based on the change pre-estimation information.

12. The pre-estimation apparatus according to claim 10, wherein the acquiring the current incremental data of the first characteristic information corresponding to the pre-estimation model further comprises:

updating, when an updating operation of the user on at least one of the multiple pieces of first characteristic information corresponding to the pre-estimation model is obtained, the current incremental data of the at least one of the multiple pieces of first characteristic information based on the updating operation.

13. The pre-estimation apparatus according to claim 10, wherein the operations further comprise:

acquiring the historical characteristic data in a historical time period and corresponding incremental information of at least one of the multiple pieces of first characteristic information, the historical time period comprising at least one computation period;

obtaining daily characteristic values of the second characteristic information between a present time and an initial point of the historical time period; and determining the pre-estimation model based on the historical characteristic data in the historical time period and the corresponding incremental information of the at least one of the multiple pieces of first characteristic information and the obtained daily characteristic values of the second characteristic information, the pre-estimation model forecasting a characteristic value on a next day of the second characteristic information.

14. The pre-estimation apparatus according to claim 10, wherein the operations further comprise:

selecting, based on an operation of a user, one of the multiple pieces of characteristic information as the second characteristic information, and selecting at least one of the remaining pieces of characteristic information as the first characteristic information required for establishing the pre-estimation model for predicting the second characteristic information.

15. The pre-estimation apparatus according to claim 10, wherein the operations further comprise:

obtaining a pre-estimation presentation instruction of a current user;

wherein determining, based on the first change information, the change pre-estimation information on the forecasting day of the second characteristic information in order to prompt the user to execute the corresponding operation based on the change pre-estimation information further comprises:

presenting at least one of the change pre-estimation information corresponding to the pre-estimation presentation instruction according to the pre-estimation presentation instruction.

16. The pre-estimation apparatus according to claim 10, wherein the operations further comprise:

identifying, for a plurality of users, the change pre-estimation information of at least one of the second characteristic information in a predetermined time period;

fitting respective change pre-estimation information of the plurality of users and the change pre-estimation information in the predefined time period of a current user to determine at least one similar user of the current user based on a result of the fitting;

determining, based on a characteristic update plan of the at least one similar user, a characteristic update plan to be recommended to the current user.

17. The pre-estimation apparatus according to claim 10, wherein the operations further comprise:

judging whether the change pre-estimation information satisfies a predetermined prompting condition, and when the change pre-estimation information satisfies the predetermined prompting condition, transmitting corresponding prompt information to a current user to prompt the user to execute the corresponding operation.

18. The pre-estimation apparatus according to claim 10, wherein the operations further comprise:

obtaining the change pre-estimation information of at least one of the second characteristic information respectively corresponding to one or more users;

performing statistics on the obtained change pre-estimation information of at least one of multiple pieces of the second characteristic information corresponding to each of the one or more users, to adjust corresponding service resource configuration based on a statistical result.

19. A non-transitory computer-readable medium comprising computer codes which, when executed, cause the method according to claim 1 to be performed.

* * * * *